United States Patent [19]

Bacou et al.

[11] Patent Number: 4,714,828
[45] Date of Patent: Dec. 22, 1987

[54] OPTOELECTRIC TRANSDUCER

[75] Inventors: Claude Bacou, Neauphle le Chateau; Rene Baptiste, Maurepas; Henri Feissel, Paris; Gilbert Takats, Saint Denis; Christian Cabrol, Plaisir, all of France

[73] Assignee: Bull S.A. (Societe Anonyme), Paris, France

[21] Appl. No.: 839,719

[22] Filed: Mar. 14, 1986

[30] Foreign Application Priority Data

Mar. 14, 1985 [FR] France ................................. 85 03745

[51] Int. Cl.[4] .............................................. H01J 40/14
[52] U.S. Cl. .................................. 250/214 C; 330/59; 330/308; 330/11
[58] Field of Search .................. 330/282, 284, 59, 308, 330/11; 250/214 C, 214 R; 455/619; 307/265, 310, 358

[56] References Cited

U.S. PATENT DOCUMENTS 4,363,977 12/1982 Tsuda ...................................... 330/11
4,429,218 1/1984 Thomas ............................ 250/214 R Primary Examiner—David C. Nelms
Assistant Examiner—Chung Seo
Attorney, Agent, or Firm—Kerkam, Stowell, Kondracki & Clarke

[57] ABSTRACT

An optoelectronic transducer is proposed which includes a PIN diode (2) that delivers a current that is proportional to a light signal that is received. The diode is connected to the input of an inverting amplifier (4) that delivers a voltage signal $v_s$. A negative feedback means of the transfer impedance type (6) is connected across the inverting amplifier. The transducer further includes a stabilizing means (8) for the amplifier gain and a temperature drift compensating means (10) for compensating for the drift in amplifier temperature. The stabilizing means (8) includes a detector (26, 28, 32) for the high peak of the signal $v_s$, and the temperature drift compensating means (10) includes a filter means (38) for producing the means value $v_m$ of the signal $v_s$, and a comparator (40) that receives the signals $v_s$ and $v_m$ and delivers a signal that reproduces the interference of the light signal that has been received. The temperature drift compensating (10) also includes a carrier wavedetection (cs) with automatic control (42). This automatic control enables very high speed detection of the carrier wave not only at a high level, but at a low level as well.

17 Claims, 7 Drawing Figures

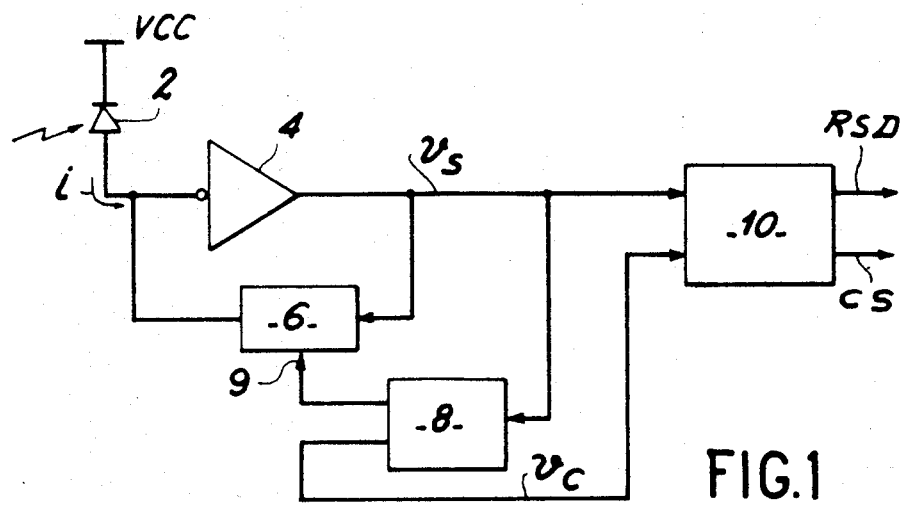
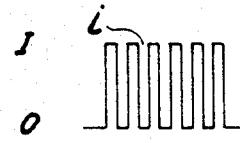
FIG.2a
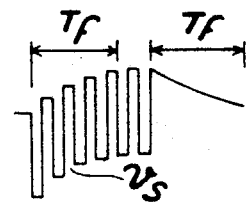
FIG.2b
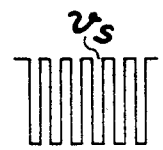
FIG.2c
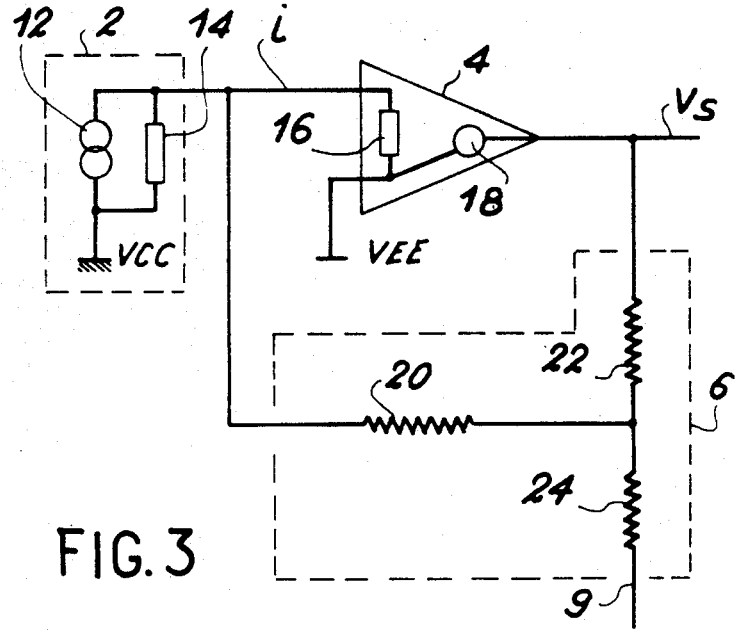
FIG.3

OPTOELECTRIC TRANSDUCER

FIELD OF THE INVENTION

The present invention relates to an optoelectronic transducer. It is used in particular as a device at the end of an optical transmission line for high-speed data rate transmission of numerical data.

BACKGROUND OF THE INVENTION

An optoelectronic transducer generally uses a known type of pickup device, such as a PIN diode, which receives the optical signals at the end of an optical transmission line and converts these optical signals into electrical signals that must then be amplified. Many problems arise in designing a transducer of this type capable of effectively processing optical signals when the signals represent numerical data originating in a remote source and when the data rate is high.

Initially, the light signals of the numeric type received by an optical line have several characteristics peculiar to them. One is the very low level of the light signal received, which after being converted by a PIN diode corresponds for example to a current that switches between 0, its value at rest, and a peak value I on the order of 1 $\mu$A. The optoelectronic transducer must amplify the signal received greatly so that it can furnish a usable signal having a voltage on the order of 100 mV. If conventional methods are used, the optoelectronic transducer must then include an amplifier having a feedback resistance of approximately 100 K$\Omega$, so as to obtain transfer impedance on the same order of magnitude.

Another particular feature of the light signal received is the very wide frequency band it occupies, which, in conjunction with high output, may be wider than 50 MHz. Given the inherent capacity of the PIN diode, which may be one the order of several picofarads, for the amplifying circuit to be able to pass this band its input impedance must be low, while its voltage gain must be high, at least equal to 200. The present problems in stabilizing the gain and the operating point of the amplifier. On the other hand, the width of the frequency response makes it impossible to use a single resistor of 100 K$\Omega$ as negative feedback in order to define the transfer impedance. The stray capacitances involved will lower its high-frequency impedance.

One known way to stabilize the gain and the operating point of the amplifier is to regulate the mean value of the amplifier output signal to a fixed set-point value by negative feedback. However, this method requires the use of a low-pass filter, which increases the response time of the transducer; that is a disadvantage, particularly when the light signal received is of the intermittent carrier type.

OBJECT AND SUMMARY OF THE INVENTION

To overcome the above problems, means are provided according to the invention for detecting the level of the peak of the amplifier output signal and applying this detected level to a low frequency negative feedback path across the amplifier.

Further according to the invention, in order to solve the problem of having high amplification without constricting the frequency response, a negative feedback resistor with relatively low value is used, to which a fraction of the output voltage of the amplifier is applied.

On the other hand, the transducer output signal must constitute an accurate image of the light signal received, because the data is linked with the position in time of its transitions.

In conventional embodiments, transitions in the received signal are detected at transducer output by comparing the output signal of the amplifier with a reference voltage. However, variations in temperature cause variations in the amplitude of the amplitude output signal and cause drifting from the operating point of this signal. As a result, phase distortions in the transducer output signal occur, which interfere with the data transmitted.

In order to overcome this disadvantage, the transducer according to the invention provides an automatic-threshold device where the reference voltage is a function of the mean value of the amplifier output signal.

In summary, the invention accordingly proposes an optoelectronic transducer which attains very wide-range amplifier frequency response and includes an amplifier associated with means for stabilizing gain and for compensating for the drift of this amplifier.

More specifically, the subject invention comprises an optoelectronic transducer including a PIN diode or an analogous diode furnishing a current in response to a light signal that is received. The diode is connected to the input of an amplifier and a negative feedback of the resistor type is connected across this amplifier. Means are provided for stabilizing the negative feedback responsive to the level of the peak of the amplifier output signal, and an automatic-threshold device furnishes an output signal in response to said amplifier output signal.

In a preferred embodiment of the optoelectronic transducer according to the invention, the stabilizing means includes a high-peak detector for generating said peak level based on said amplifier output signal and a differential amplifier that receives said peak level at one of its inputs and receives a reference signal at the other of its inputs, the output of said differential amplifier furnishing a signal stabilizing said negative feedback.

According to a further feature of the invention, the stabilizing means includes a means for translating the voltage level of said stabilizing signal, which furnishes said negative feedback with a shifted stabilizing signal having a means value equal to the mean value of the input voltage of the amplifier.

In a further feature of the invention, the level-translating means includes a resistor connected via one of its terminals to the output of the differential amplifier, and a means of automatic control of the current circulating in the resistor, such that the voltage drop in the resistor is equal to the voltage shift value as desired.

In still another feature of the invention, the negative feedback comprises three resistors connected in a star pattern, the ends of which are respectively connected to the input of said amplifier, the output of said amplifier, and the output of the stabilizing means.

Another feature of the invention provides that the input stage of the inverting amplifier is a transistor connected as a common emitter, that the following stages are pairs of transistors including a transistor wired as a common collector and a transistor wired as a common base, and that the output stage is connected as a common collector.

In a further feature of the invention, the automatic-threshold device includes a filter means for delivering a signal representing the mean value of the voltage output signal, and a comparator receiving these signals and delivering an image signal of the current furnished by the light detecting diode.

The invention may also include another comparator that receives the peak level and the mean value and delivers a signal indicative of the presence of a carrier wave at the input of the amplifier, and a conditioner that receives this indicator signal and the current image signal.

In the optoelectronic transducer according to the invention, the conditioner is a logic gate that delivers the output signal when the indicator signal is in a logic state that indicates the presence of a carrier wave.

The characteristics and advantages of the invention will be better understood from the ensuing detailed description, which is given by way of example but is understood not to limit the invention, taken in conjunction with the drawings.

BRIEF DESCRIPTION OF THE DRAWINGS

FIG. 1 is a schematic illustration of an optoelectronic transducer according to the invention;

FIGS. 2a, 2b and 2c, respectively, show the current i delivered by the PIN diode, the response $v_s$ of a conventional transducer with a stabilized mean value of $v_s$, and the response $v_s$ of a transducer according to the invention;

FIG. 3 schematically shows the diode, the amplifier, and its negative feedback, which is of the trans-impedance type;

DESCRIPTION OF THE PREFERRED EMBODIMENTS

Figure 4:
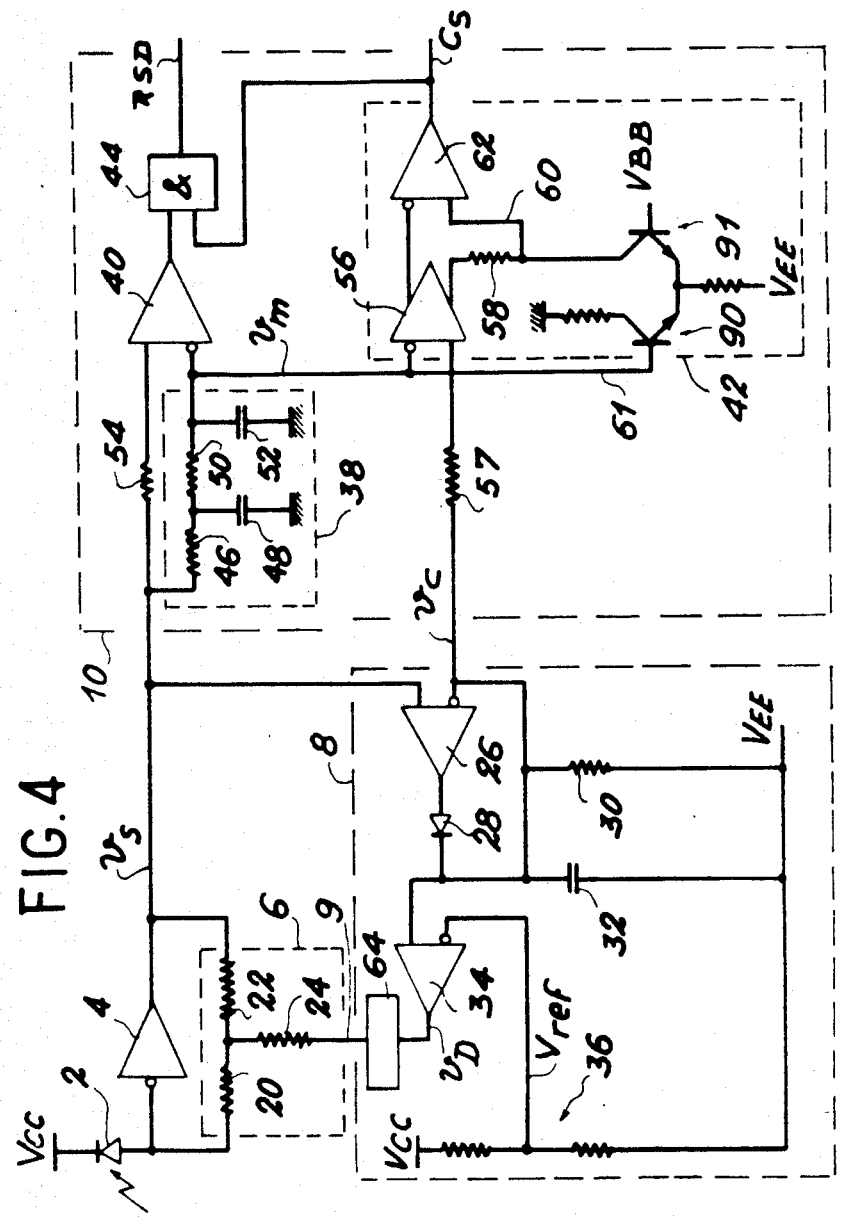
FIG. 4 schematically shows an embodiment of the optoelectronic transducer according to the invention.

FIG. 1 is a schematic illustration of the automatic-threshold optoelectronic transducer according to the invention. It includes a PIN doide 2 that receives a light signal and delivers a current i; an inverting amplifier 4; a negative feedback resistor means 6 of the trans-impedance type; a means 8 for stabilizing the operating point of the amplifier; and an automatic-threshold device 10 that assures compensation for the drift in temperature.

The diode 2 delivers an electric current i corresponding to the light signal that is received. The value of the peak I of this electric current is at a very low level, on the order of 1 µA. This current is converted into a voltage $v_s$ by an amplifier 4. A negative feedback means 6 connected across the amplifier defines the transfer impedance. This impedance is generally high since the output voltage $v_s$ of the amplifier is on the order of 100 mV as an example.

In conventional embodiments, stabilizing the operating point of the amplifier is obtained by continuous negative feedback with the mean value $v_m$ of the signal $v_s$ being automatically controlled to a fixed set-point value. The signal $v_m$ is obtained by processing the $v_s$ in a low-pass filter that has a response time of $T_f$, for example. FIG. 2b shows the response $v_s$ of such a device for an input signal i shown in FIG. 2a. At the carrier wave stage, the signal $v_s$ is unusable for the period $T_f$.

It will be seen from FIG. 2a that the stable level in the input signal i of the amplifier is that of the low peak. It equals zero with or without a carrier wave. Taking the inversion in the amplifier 4 into account, it is accordingly necessary to maintain the high peak of the signal $v_s$ at a stable level.

In the transducer according to the invention, this stability is obtained by a continuous negative feedback determined by the means 8. FIGS. 1 and 4 show the stabilizing means 8, which includes a detector for the high peak of the signal $v_s$ that delivers a signal $v_c$, as well as a differential amplifier 34 that delivers a signal $v_D$ that is proportional to the difference between $v_c$ and a direct reference voltage. After processing in a level translator 64, the signal $v_D$ is applied to the input 9 of the negative feedback means 6. FIG. 2c shows the response in $v_s$ of such a device to the input signal shown in FIG. 2a. Thus the stabilizing means 8 according to the invention enables the use of the optoelectronic transducer in an optical link functioning with an intermittent carrier wave, that is, in a "bus"-type environment.

The automatic-threshold device 10 receives the signals $v_s$ and $v_c$ at its inputs. It delivers a signal RSD, which is an image of the light signal received, and a signal CS, which indicates the presence of the carrier wave.

The data contained in the light signal that is received is associated with the position in time of its transitions. The signal RSD must accordingly reproduce the position of the transitions with a very diminished phase distortion.

In conventional embodiments, RSD is emitted by a comparator that at its inputs receives the signal $v_s$, on the one hand, and a direct reference voltage, on the other. Since the transitions of the signal $v_s$ are not infinitely brief, phase distortions accordingly result from variations in the amplitude of $v_s$, and drifting in the level of repose of the signal relative to the reference voltage, in partiuclar when the temperature is variable.

These causes of distortion are diminshed in the automatic-threshold device according to the invention. A filter means in the invention delivers a signal $v_m$ representing the mean value of $v_s$, and the signal $v_m$ is substituted for the direct reference voltage at one of the inputs of the comparator. This comparator compares the signal $v_s$ to its own mean value. Thus the compensation is very efficient, if the transmission code that is used is of the DC free type. The result is a transducer that has a high dynamic range, associated with a very low phase distortion measured in the signal RSD, in particular as a function of temperature.

With the same care of drift compensation, the detection of the carrier wave is effected by a differential threshold device, which compares the peak value $v_c$ to the mean value $v_m$ of the same signal $v_s$ and delivers a signal CS that is indicative of the presence of the carrier wave.

The schematic diagram of FIG. 3 illustrates the constraints in designing the negative feedback 6. In this figure, the PIN diode 2 has been represented from the electrical point of view as the equivalent of a current source 12 and an impedance 14. This impedance is practically reduced to a capacitance of a few picofarads. In like manner, the inverting amplifier 4 has been represented as the electrical equivalent of an input impedance 16 and a voltage source 18.

The value of the impdedance 14 dictates that the resistive component of the impedance at the input node of the amplifier, which comprises the impedance 14 of the diode, the input impedance 16 of the amplifier and the resistance of the negative feedback 6, be less than a few hundred ohms, so that the frequency response of the amplifier 4 will be high. On the other hand, since a signal $v_s$ of large amplitude is desired, the transfer impedance provided by negative feedback to the amplifier 5 must have a value on the order of 100 K$\Omega$.

A negative feedback resistor of this value cannot be used directly, given the frequency response desired. The negative feedback 6 therefore includes a resistor 20 on the order of 10 K$\Omega$, the effect of which is multiplied by applying to it a fraction of the voltage $v_s$.

By way of example, a negative feedback circuit has been designed having resistors 20, 22 and 24, with the respective values of 7.5 K$\Omega$, 8 K$\Omega$, and 610$\Omega$. The resultant transfer impedance is 115.5 K$\Omega$.

The current i received by the amplifier 4 is very low, so it is important to limit the input noise of this amplifier. To do so, it is advantageous to use the transistor of the input stage of the amplifier in a circuit wired in a configuration common emitter. Furthermore, always with the purpose of limiting noise, the negative-feedback signal furnished by the stabilizing means 8 is preferably applied to the cold point of the negative feedback 6, that is, to the free end 9 of the resistor 24 and at a level close to $V_{EE}$. Also, to assure amplifier stability, the following stages preferably comprise pairs of transistors, with the first transistor of each pair wired in the common collector configuration and the second wired in the common base configuration. Since the input impedance of these circuits remains appropriate for the elevated frequencies, these stages have a wide frequency response. By way of example, these transitions may be of the class $F_t=5$ GHz, with low noise, of the BFR 90 type of RTC. Given the above information, one skilled in the art will readily be able to design an appropriate amplifier, so that a further detailed explanation is not necessary.

Since the characteristics of the transfer impedance amplifier device have been described, one embodiment of the stabilizing means and of the automatic-threshold device will now be described, referring to FIG. 4.

The stabilizing means 8 principally includes a high-peak detector comprising a differential amplifier 26, a diode 28 and a capacitor 32. At its non-inverting inputs, the differential amplifier 26 receives the signal $v_s$ delivered by the amplifier 4, and at its inverting input it receives the signal $v_c$ delivered by the capacitor 32 charged by the diode 28, which is connected to the output of the amplifier 26. The signal $v_c$ is applied to the non-inverting input of a differential amplifier 34, the inverting input of which receives a reference voltage $V_{ref}$. This voltage is delivered via a resistor bridge 36. The signal $v_D$ that is delivered by the output of differential amplifier 34 is applied to the input of the level-translating means 64, the output of which is applied to the end 9 of the negative feedback resistor 24.

The level-translating means 64 will now be described, referring to FIG. 5.

In an ECL embodiment described by way of example, the external power supply furnishes voltages $V_{CC}=0$ V and $V_{EE}=-5.2$ V. The circuit includes stabilized integrated power supply means $V_{BB}$ and $V_{CS}$ furnishing respective voltages of $-1.3$ V and $+1.3$ V with respect to $V_{CC}$ and $V_{EE}$.

In the exemplary embodiment being described, the amplifier 34 is such that its output signal $v_D$ is at a mean potential $V_D$ in the vicinity of $V_{BB}=-1.3$ V.

The signal $v_D$ could be applied to the input 9 of the negative feedback 6. To assure the proper polarization to the PIN diode 2, the emitter of the input transistor of the amplifier 4 is connected to $V_{EE}$; if $V_{BE1}$ is the emitter base polarizing voltage, the mean potential at the node 9 is in the vicinity of $V_{EE}+V_{BE1}$. Thus the signal $v_D$ must be translated from $V_D\simeq 1.3$ to $V_{DT}\simeq V_{EE}+V_{BE1}$, and to proceed such that $V_{BE1}$ has little dependency on $V_{CC}-V_{EE}$.

In conventional embodiments, this type of translation is performed via PNP transistors. In contrast, the opto-electronic transducer according to the invention includes a circuit that enables the use of PNP transistors only.

Figure 5:
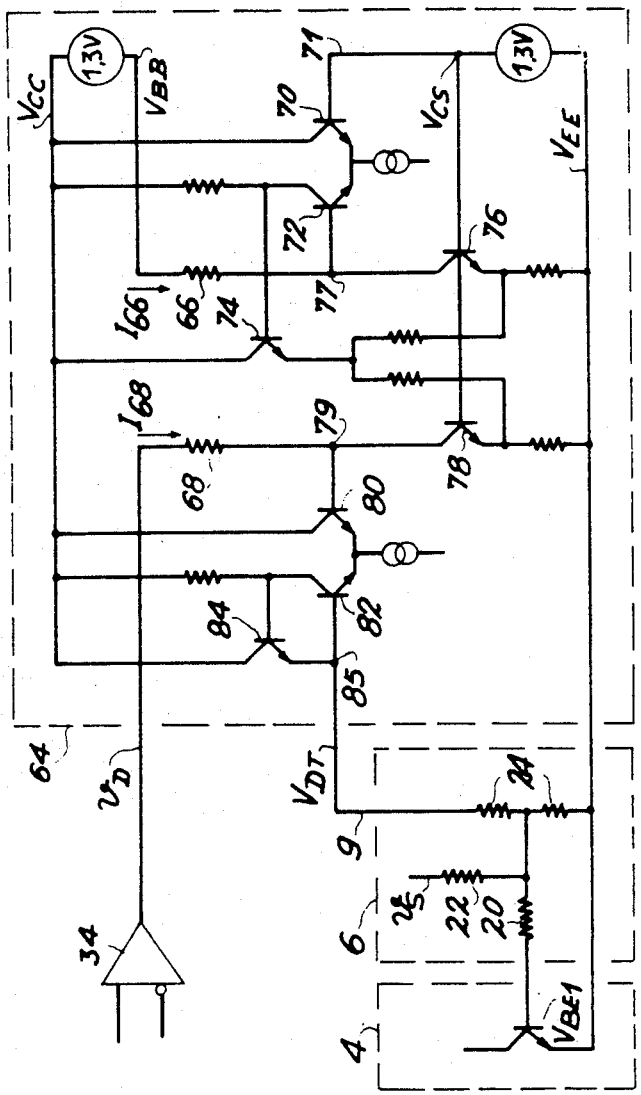
FIG. 5 is a schematic illustration of an embodiment of the level-translating means that is part of the stabilizing means according to the invention.

In practice, the resistor 24 is replaced with the equivalent bridge shown in FIG. 5. The hot point of this bridge receives $v_D$, translated to the mean level $V_{DT}=V_{EE}+1.3$ V, hence a translation $$V_D-V_{DT}=V_{VV}-V_{CS}.$$

To accomplish this, potential differences equal to $V_{BB}-V_{CS}$ are developed at the terminals of the two identical resistors 66 and 68.

To accomplish this, the circuit shown in FIG. 5 includes two transistors 70, 72, the emitters of which are connected to one another and to a current source. The base 71 of the first transistor is supplied with the voltage $V_{CS}$, and its collector is supplied with $V_{CC}$. The second transistor 72 has its collector connected on the one hand to $V_{CC}$, by the intermediary of a resistor, and on the other hand to the base of a third transistor 74. The base 77 of the second transistor 72 is supplied with the voltage $V_{BB}$, by the intermediary of the resistor 66, and is also connected to the collector of a fourth transistor 76, the emitter of which is connected to the voltage $V_{EE}$ by the intermediary of a resistor. The collector of the third transistor 74 is supplied with the voltage $V_{CC}$, while its emitter is connected first, by the intermediary of a resistor, to the emitter of the fourth transistor 76 and second, by the intermediary of another resistor, to the emitter of a fifth transistor 78, the base of which is supplied with the voltage $V_{CS}$ and the emitter of which is connected to the voltage $V_{EE}$ across a resistor. The collector 79 of the transistor 78 is connected to the output of the amplifier 34 by the intermediary of the resistor 68.

The circuit comprising the transistors 70, 72, 74, 76 is such that the potentials at 71 and 77 are equal to $V_{CS}$. The result is a current I66 in the resistor 66.

Because of the symmetry of the circuit including the transistors 74, 76, 78, the current is equal to the current I68 that circulates in the resistor 68.

If the resistors 66 and 68 are identical, the potential at the node 79 is the potential $v_D$ translated from $V_{BB}-V_{CS}$.

To complete the circuit, a sixth transistor 80, the base of which is connected to the collector 79 of the transistor 78, has its collector supplied with the voltage $V_{CC}$, and its emitter is connected first to a current source and second to the emitter of a seventh transistor 82. The collector of the transistor 82 is connected to the base of an eighth transistor 84 and to the voltage $V_{CC}$ across a resistor. The collector of the eighth transistor 84 is supplied with the voltage $V_{CC}$, while its emitter 85 is connected to the base of the transistor 82 and to the end 9 of the negative feedback resistor 24.

The circuit comprising the transistors 80, 82, 84 is such that the potentials at the nodes 79 and 85 are equal.

At the node 85, the shifted signal $v_D$ thus appears with a mean potential $V_{DT} = V_D - (V_{BB} - V_{CS})$.

The automatic-threshold device 10 is described in conjunction with FIG. 4. It principally includes a filter means 38 for furnishing a mean signal $v_m$, a differential amplifier 40 that at its input receives the signals $v_s$ and $v_m$, a carrier wave detector 42 and a conditioner 44.

The filter means 38 comprises two low-pass filters, which are formed respectively by a resistor 46 and a capacitor 48; a resistor 50; and a capacitor 52. At its input, this means receives the signal $v_s$ delivered by the amplifier 4 and in turn delivers a signal $v_m$ equal to the mean value of the signal $v_s$. This signal $v_m$ is used first by the differential amplifier 40 and second by the carrier wave detector 42.

Comparing the signals $v_s$, which is received via a balancing resistor 54, and $v_m$, in the differential amplifier 40 enables faithful reproduction of the interference values of the signal emitted. The translations obtained by this means introduce only minimal phase distortion, making a high-performance link possible.

The signal $v_m$ is also applied to the inverting input of a differential amplifier 56 and to the control means 61 of a threshold system automatically controlled to the mean value $v_m$, which are elements of the carrier wave detector 42. The non-inverting input of this amplifier 56 receives the peak signal $v_c$ across a balancing resistor 57. Comparing the signal $v_m$ to the signal $v_c$ makes it possible to suppress the temperature drift, which for a signal $v_s$ having an amplitude on the order of 100 mV is quite elevated, so that the detection of the carrier wave can be done by comparing the signal $v_m$ to a fixed voltage.

The signal delivered by the differential amplififer 56 is applied to the non-inverting input of the differential amplifier 62 after the introduction of a threshold via the resistor 58 and the current source 60 that is automatically controlled to the mean value $v_m$. The automatic threshold control means (FIG. 4) comprises two transistors 90 and 91 in a differential circuit, comprising a current source. The current collector of the transistor 91, which defines the threshold at the non-inverting input of the differential amplifier 62, is proportional to the mean value $v_m$ applied to the base of the transistor 90. A reference voltage $V_{BB}$ is applied to the base of the transistor 91. This automatic control enables good detection of the carrier wave not only at a high level but at a low level as well. The signal CS delivered by the differential amplifier 62 indicates by its state, that is, HIGH or LOW, the presence or absence of the carrier wave.

Finally, this signal CS is used for conditioning the signal delivered by the differential amplifier 40, so that the signal RDS remains at its level of repose when a carrier wave is absent.

What is claimed is:

1. An optoelectronic circuit transducer comprising a diode (2) for providing a current in response to reception of a light signal, an amplifier (4) having an input connected to receive current from said diode and having an output, a negative feedback transfer impedance (6) connected between the amplifier output and the amplifier input, a stabilizing means (8) stabilizing the negative feedback of the transfer impedance responsive to the level of the peak ($v_c$) of the output signal ($v_s$) of the amplifier (4), and an automatic threshold device (10) supplying an output signal (RSD) in response to an output signal of said amplifier, and wherein said transfer impedance includes first, second, and third resistors, each resistor having a first end connected to a common node, and said first resistor also has a second end connected to the amplifier input, said second resistor also has a second end connected to the amplifier output, and said third resistor also has a second end connected to said stabilizing means (8).

2. An optoelectronic transducer circuit as defined by claim 1, wherein the stabilizing means (8) includes a high-peak detector (26, 28, 32) for generating said peak level ($v_c$) based on said output signal ($v_s$) of the amplifier (4) and a differential amplifier (34) connected to receive said peak level ($v_c$) at one input and receive a reference signal ($v_{ref}$) at another input, the output of said differential amplifier (34) connected to said transfer impedance (6) for furnishing a signal ($v_D$) stabilizing said negative feedback.

3. An optoelectronic transducer circuit as defined by claim 2, wherein said stabilizing means (8) includes a means (64) for translating the voltage level of said stabilizing signal ($v_D$) and furnishing to said transfer impedance (6) a shifted stabilizing signal having a mean value ($V_{DT}$) equal to the mean value of the voltage at the input of the amplifier (4).

4. An optoelectronic transducer circuit as defined by claim 3, wherein said level-translating means (64) includes a resistor (68) connected via one terminal to the output of the differential amplifier (34), and a means of automatic control of the current circulating in said resistor (68), such that the voltage drop in the resistor (68) is equal to the voltage value shifted as desired.

5. An optoelectronic transducer circuit as defined by claim 4, wherein said automatic control means is realized by a circuit with a plurality of transistors of the NPN type (70, 72, 74, 76, 78, 80, 82, 84).

6. An optoelectronic transducer circuit as defined by claim 1 wherein said amplifier (4) is an inverting amplifier and includes an input stage having a transistor connected in a common emitter configuration, following stages having pairs of transistors including a transistor wired in a common collector configuration and a transistor wired in a common base configuration, and an output stage having a transistor connected in a common collector configuration.

7. An optoelectronic transducer circuit as defined by claim 1 wherein the automatic threshold device (10) includes a filter means (38) connected to an input of the automatic threshold device for delivering a signal representing the mean value ($v_m$) of the voltage signal ($v_s$), and a comparator (40) connected to receive said signals ($v_s$, $v_m$) and deliver an image signal (i) of the current furnished by said diode (2).

8. An optoelectronic transducer circuit as defined by claim 7, further including another comparator (42) connected to receive the peak level ($v_c$) and said mean value ($v_m$) and delivers a signal (CS) that is indicative of the presence of a carrier wave at the input of the amplifier, and a conditioner (44) connected to receive said indicator signal (CS) and said current image signal (i).

9. An optoelectronic transducer circuit as defined by claim 8, wherein said conditioner (44) is a logic gate that delivers the output signal (RSD) when said indicator signal (CS) is in a logic state that indicates the presence of a carrier wave.

10. An optoelectronic transducer circuit as defined by claim 2 wherein said amplifier (4) is an inverting amplifier and includes an input stage having a transistor connected in a common emitter configuration, following stages having pairs of transistors including a transistor wired in a common collector configuration and a transistor wired in a common base configuration, and an output stage having a transistor connected in a common collector configuration.

11. An optoelectronic transducer circuit as defined by claim 2 wherein the automatic threshold device (10) includes a filter means (38) connected to an input of the automatic threshold device for delivering a signal representing the mean value ($v_m$) of the voltage signal ($v_s$), and a comparator (40) connected to receive said signals ($v_s$, $v_m$) and deliver an image signal (i) of the current furnished by said diode (2).

12. An optoelectronic transducer circuit as defined by claim 11, further including another comparator (42) connected to receive the peak level ($v_c$) and said mean value ($v_m$) and delivers a signal (CS) that is indicative of the presence of a carrier wave at the input of the amplifier, and a conditioner (44) connected to receive said indicator signal (CS) and said current image signal (i).

13. An optoelectronic transducer circuit as defined by claim 8, wherein said conditioner (44) is a logic gate that delivers the output signal (RSD) when said indicator signal (CS) is in a logic state that indicates the presence of a carrier wave.

14. An optoelectronic transducer circuit as defined by claim 3 wherein said amplifier (4) is an inverting amplifier and includes an input stage having a transistor connected in a common emitter configuation, following stages having pairs of transistors including a transistor wired in a common collector configuration and a transistor wired in a common base configuration, and an output stage having a transistor connected in a common collector configuration.

15. An optoelectronic transducer circuit as defined by claim 3 wherein the automatic threshold device (10) includes a filter means (38) connected to an input of the automatic threshold device for delivering a signal representing the mean value ($v_m$) of the voltage signal ($v_s$), and a comparator (40) connected to receive said signals ($v_s$, $v_m$) and deliver an image signal (i) of the current furnished by said diode (2).

16. An optoelectronic transducer circuit as defined by claim 15, further including another comparator (42) connected to receive the peak level ($v_c$) and said mean value ($v_m$) and delivers a signal (CS) that is indicative of the presence of a carrier wave at the input of the amplifier, and a conditioner (44) connected to receive said indicator signal (CS) and said current image signal (i).

17. An optoelectronic transducer circuit as defined by claim 16, wherein said conditioner (44) is a logic gate that delivers the output signal (RSD) when said indicator signal (CS) is in a logic state that indicates the presence of a carrier wave.

* * * * *

UNITED STATES PATENT AND TRADEMARK OFFICE
CERTIFICATE OF CORRECTION

PATENT NO. : 4,714,828

DATED : December 22, 1987

INVENTOR(S) : BACOU et al

It is certified that error appears in the above-identified patent and that said Letters Patent is hereby corrected as shown below:

In the Abstract, line 14, "means" should be --mean--.

In the Abstract, line 18, "wavedetection" should be --wave detection--.

Claim 1, line 1, "circuit transducer" should be --transducer circuit--.

Signed and Sealed this

Thirtieth Day of May, 1989

Attest:

DONALD J. QUIGG

Attesting Officer

Commissioner of Patents and Trademarks